United States Patent
Wang

(10) Patent No.: US 7,733,700 B2
(45) Date of Patent: Jun. 8, 2010

(54) METHOD AND STRUCTURES FOR HIGHLY EFFICIENT HOT CARRIER INJECTION PROGRAMMING FOR NON-VOLATILE MEMORIES

(75) Inventor: Lee Wang, Diamond Bar, CA (US)

(73) Assignee: Flashsilicon, Inc., Diamond Bar, CA (US)

( * ) Notice: Subject to any disclaimer, the term of this patent is extended or adjusted under 35 U.S.C. 154(b) by 121 days.

(21) Appl. No.: 11/779,838

(22) Filed: Jul. 18, 2007

(65) Prior Publication Data

US 2009/0021984 A1    Jan. 22, 2009

(51) Int. Cl.
G11C 11/34    (2006.01)

(52) U.S. Cl. .......................... 365/185.18; 365/185.19; 365/185.24; 365/185.26; 365/185.27; 365/185.28; 365/185.29; 365/185.33

(58) Field of Classification Search ............ 365/185.18, 365/185.19, 185.24, 185.26, 185.27, 185.28, 365/185.29, 185.33
See application file for complete search history.

(56) References Cited

U.S. PATENT DOCUMENTS

| | | | | |
|---|---|---|---|---|
| 6,002,611 A | * | 12/1999 | Ogura et al. ........... | 365/185.28 |
| 6,891,220 B2 | * | 5/2005 | Yeh et al. .................... | 257/314 |
| 7,224,620 B2 | * | 5/2007 | Thomas .................. | 365/185.29 |
| 7,265,421 B2 | * | 9/2007 | Madurawe ................... | 257/348 |
| 7,352,631 B2 | * | 4/2008 | Burnett et al. ......... | 365/185.24 |
| 7,355,891 B2 | * | 4/2008 | Wong .................... | 365/185.18 |
| 7,499,336 B2 | * | 3/2009 | Liu et al. ............... | 365/185.28 |
| 2007/0158733 A1 | * | 7/2007 | Huang et al. | |

* cited by examiner

Primary Examiner—Trong Phan
(74) Attorney, Agent, or Firm—Haynes and Boone, LLP

(57) ABSTRACT

A method programs a memory cell by controlling a reverse bias voltage across the PN junction between a source electrode of a MOSFET in the memory cell and the substrate, and pulling back the pinch-off point of the inversion region toward the source electrode, thereby increasing the programming efficiency of the memory cell. The method applies the main positive supply voltage $V_{cc}$ to the drain electrode of the memory cell from the chip main voltage supply, rather than the conventional method of using a higher voltage than $V_{cc}$. To optimize the programming condition, the source voltage and the substrate voltage are adjusted to achieve the maximum threshold voltage shifts under the same applied gate voltage pulse condition (i.e. using the gate pulse with the same voltage amplitude and duration regardless of the source voltage and the substrate voltage). The substrate voltage to the drain voltage can not exceed the avalanche multiplication junction breakdown for a small programming current during the bias voltage adjustment.

38 Claims, 10 Drawing Sheets

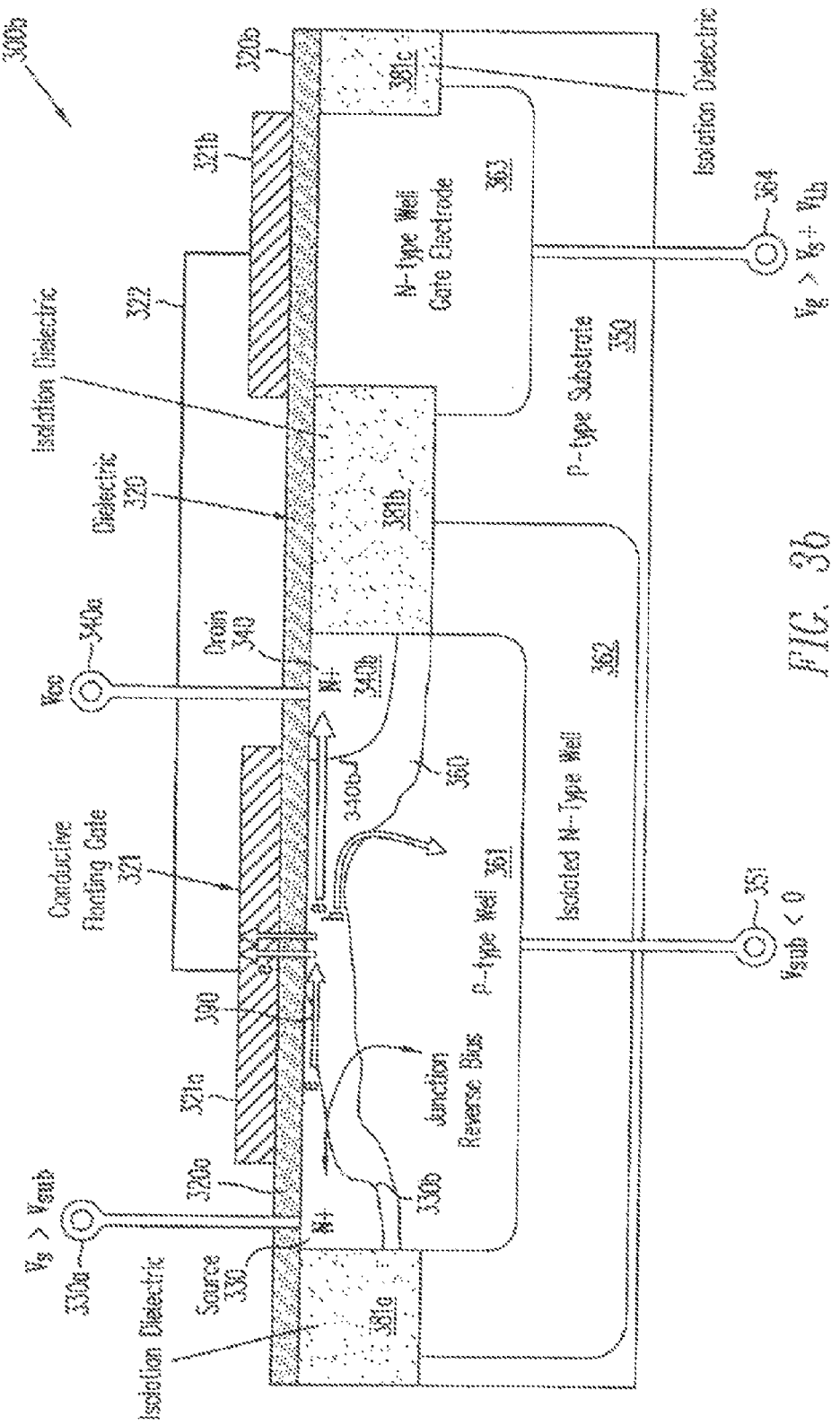

METHOD AND STRUCTURES FOR HIGHLY EFFICIENT HOT CARRIER INJECTION PROGRAMMING FOR NON-VOLATILE MEMORIES

FIELD OF INVENTION

This invention relates to methods and structures for programming Non-Volatile Memory (NVM) cells using highly efficient Hot Carrier Injection (HCI).

BACKGROUND OF INVENTION

As shown in FIG. 1, metal oxide semiconductor field effect transistor 10 (MOSFET) includes a source 13 and a drain 14 (connected respectively to source electrode 13a and drain electrode 14a) each with an impurity type opposite to the impurity type of the substrate 15. The source 13 and drain 14 are separated by a channel region in the substrate 15 underlying a control gate 11 formed over a dielectric layer 12 on top of the silicon substrate 15. When the voltage applied to the gate electrode 11a electrically connected to control gate 11 exceeds the threshold voltage of the MOSFET 10, the channel region in the substrate 15 between the source 13 and the drain 14 and just below the dielectric 12 under the control gate 11 of the MOSFET device 10 is inverted to the same conductivity type as the source 13 and drain 14 to make electrical connection between source 13 and drain 14. A non-volatile memory (NVM) cell stores information by placing charges in the storing material 12b between the control gate 11 and the channel region of the MOSFET 10. In FIG. 1, charge is shown as being stored in region 12b of dielectric 12 but it should be understood that the charge could be stored on a conductive floating gate in region 12b or in nanocrystals in the dielectric 12 such as the region 12c above 12b or the region 12a below 12b. Thus the storing material can be a conducting material such as highly doped poly-silicon, charge trapping dielectric such as a nitride film, or nano crystals. By placing charges in the storing material 12b in an NVM cell, the threshold voltage of the MOSFET device 10 can be altered. Various values of information can thus be stored in an NVM cell by placing various amounts of charge in the storing material 12b to alter the threshold voltage level of the NVM cell. The value of the information stored corresponds to the amount of charge stored which in turn can be determined by determining the threshold voltage of the MOSFET device 10 in the cell. The stored charges in an NVM cell are not volatile even when the power for the NVM device is turned off. The information stored in an NVM cell can be retrieved by determining and reading out the threshold voltage of the MOSFET 10 in the NVM cell.

To place different amounts of charge in the storing material 12b of an NVM cell is called "programming" or "writing". In contrast, to erase an NVM cell, the stored charges must be removed from the storing material 12b. The method used to program an NVM cell has been based on three mechanisms: 1. Hot Carrier Injection (HCI); 2. Fowler-Nordheim (FN) tunneling; 3. Band-to-band tunneling (See. IEEE Std 1005-1998 and IEEE Std 641-1987). HCI and FN tunneling are the two most commonly used programming mechanisms for NVM devices. HCI is the fastest programming method to obtain the desired threshold voltage shift associated with MOSFET 10 in an NVM cell but uses large programming current, while FN tunneling uses little programming current but requires a longer programming time to achieve the desired threshold voltage shift.

Conventional HCI programming applies a relatively high voltage (greater than $V_{cc}$, the regular supply voltage applied to the memory during normal operation) to the drain electrode 14a and the control gate electrode 11a of the MOSFET 10 in an NVM cell, while the substrate 15 or source electrode 13a are connected to ground. In such a way, an inverted region 17 (i.e. a region with the same conductivity type as the source 13) is created in the channel region adjacent to the source 13 extending toward, but not reaching the drain 14. A depletion region 16 as shown in FIG. 1 is formed beneath the source 13, the inverted region 17, in the channel region directly beneath the gate electrode 11 but beyond the point 19 where the inverted region 17 ends (called the "pinch-off point") and beneath the drain 14. A high lateral electric field is created in the depletion region 16 between the pinch-off point 19 and the drain electrode 14. As shown schematically in FIG. 1, the channel inversion layer 17 is wider near the source 13 and narrows as it approaches the pinch-off point 19. As the charge carriers current $I_s$ at the source side passes through the pinch-off point 19, the charges, now forming current $I_d$ at the drain side are strongly accelerated toward the drain 14 in the high field of the drain-depletion region (i.e. the portion of depletion region 16 between pinch-off point 19 and drain 14). As a result, the charge carriers are scattered in a direction such as to reach the Si/SiO$_2$ interface (i.e. the interface between the silicon substrate 15 and the SiO$_2$ (dielectric 12). The shape of the SiO$_2$ (dielectric 12) energy barrier varies along with the channel length (i.e. the length of inversion region 17) due to the substrate 15 surface potential variation induced by the applied constant control gate 11 voltage and constant drain 14 voltage bias. Consequently, near the source electrode 13, the oxide field is very strongly biased toward the direction of gate 11 but with almost no available hot carriers for injection into the storing material 12b. While abundant hot carriers are generated near the depletion region between pinch-off point 19 and drain electrode 14, there is only a very small electric field from oxide 12 to substrate 15 (called the "oxide field") near the pinch-off point 19 in the depletion-drain region (i.e. in the region between the pinch-off point 19 and drain 14) to collect the hot carriers, which form a weak substrate current $I_{sub}$. Less than one per million of hot carriers is collected toward the oxide field and thus flows into storage material 12b. With injection of carriers from the source 13, a large number of secondary carriers generated in the depletion-drain region flow into the drain electrode 14 and fractions of them flow into the substrate 15. The programming efficiency is thus very low. The typical programming current flowing through the drain electrode 14 of MOSFET 10 in an NVM cell is around hundreds of microampere per cell and only a small fraction of the current flows to the charge storage material 12b.

In the conventional wisdom, the applied drain voltage cannot be lower than 3.1 V, which is the oxide barrier voltage for electrons to move inside the oxide field, for programming the MOSFET 10 in an NVM device using the HCI scheme (See Kinam Kim and Gitae Jeong, ISSCC Tech. Dig, pp. 576-577, 2005). This conventional belief imposes the condition that the drain 14 voltage must be higher than 3.2 volts and the drain electrode 14a must be supplied with a higher voltage supply usually between 3.5 volts to 6 volts. While MOSFET devices are scaled down to a smaller geometry, the main voltage supply, $V_{cc}$ is scaled down accordingly. For example, the main voltage supply is as low as 1 volt for the technology nodes in nanometer scale generations. Thus, in the conventional HCI programming scheme, charge pumping circuitry is required to supply voltages higher than $V_{cc}$ to the drain electrode 14a of NVM cells. It becomes very challenging for charge pump circuit design to support a high current load while maintaining a constant higher drain 14 voltage bias during programming MOSFET 10 in an NVM cell. For parallel programming an array of NVM cells, the programming uniformity can also be compromised from the high voltage supply dropout due to high current load. Due to this programming voltage bias incompatibility with the main voltage supply $V_{cc}$ (ie, the programming voltage must be higher than $V_{cc}$), a complicated high voltage decoder including high voltage level shifters in the bitlines of an NVM array is also required for selective bitline switching.

SUMMARY OF THE INVENTION

According to this invention, new HCI programming methods are provided to improve the programming efficiency, that is, to provide a higher injection rate toward the control gate 11 and into the storage material 12b with lower device current between source 13 and drain 14 to achieve the higher threshold voltage shifts of MOSFET device 10 with small programming current. In accordance with this invention, the highest current path of the device drain electrode is moved away from the high voltage path of charge pumping circuitry to the main voltage supply $V_{cc}$, which has more current capacity with a lower voltage drop from the external power source. Since only the main voltage supply $V_{cc}$ is applied to the bitlines of an array of NVM cells (connected to the drain electrodes of a column of NVM cells), the ordinary logic circuitry to control the NVM array can be used for the selective bitline switching. The more complicated high voltage decoder with high voltage level shifters used in the prior art programming of the MOSFET 10 in an NVM cell is not required for switching the bitlines of an NVM array. This simplifies the bitline design in arrays of NVM cells. Due to smaller programming current and by shifting the current load to the main voltage supply $V_{cc}$, parallel programming is enabled for more NVM cells than in the prior art with improved programming uniformity in one programming cycle. Consequently, the disclosed programming method can lead to a very fast parallel programming operation in Non-Volatile Memory array devices.

For a better understanding of the present invention and to show how the present invention may be carried into effect, reference will now be made to the following drawings, which show the preferred embodiment of the present invention.

DESCRIPTION OF THE DRAWINGS

FIGS. 3(a) and 3(b) show the schematics of structures associated with the proposed HCI programming for (a) an N-type single-gate NVM cell built in a P-type substrate 350 with N-type well gate electrode 363a and for (b) an NVM cell built in an isolated P-type well 361 which can be supplied with a negative voltage through electrode 351, respectively. In both schematics during programming the drain electrode 340a of the N-type MOSFET in the NVM cell is supplied with the main voltage supply, $V_{cc}$.

DETAILED DESCRIPTION OF THE PREFERRED EMBODIMENT

The present invention includes methods and structures to optimize the Hot Carrier Injection programming for NVM cells. Those of ordinary skill in the art will immediately realize that the embodiments of the present invention described herein are illustrative only and are not intended to be in any way limiting. Other embodiments of the present invention will readily suggest themselves to such skilled persons having the benefits of this disclosure.

Figure 2:
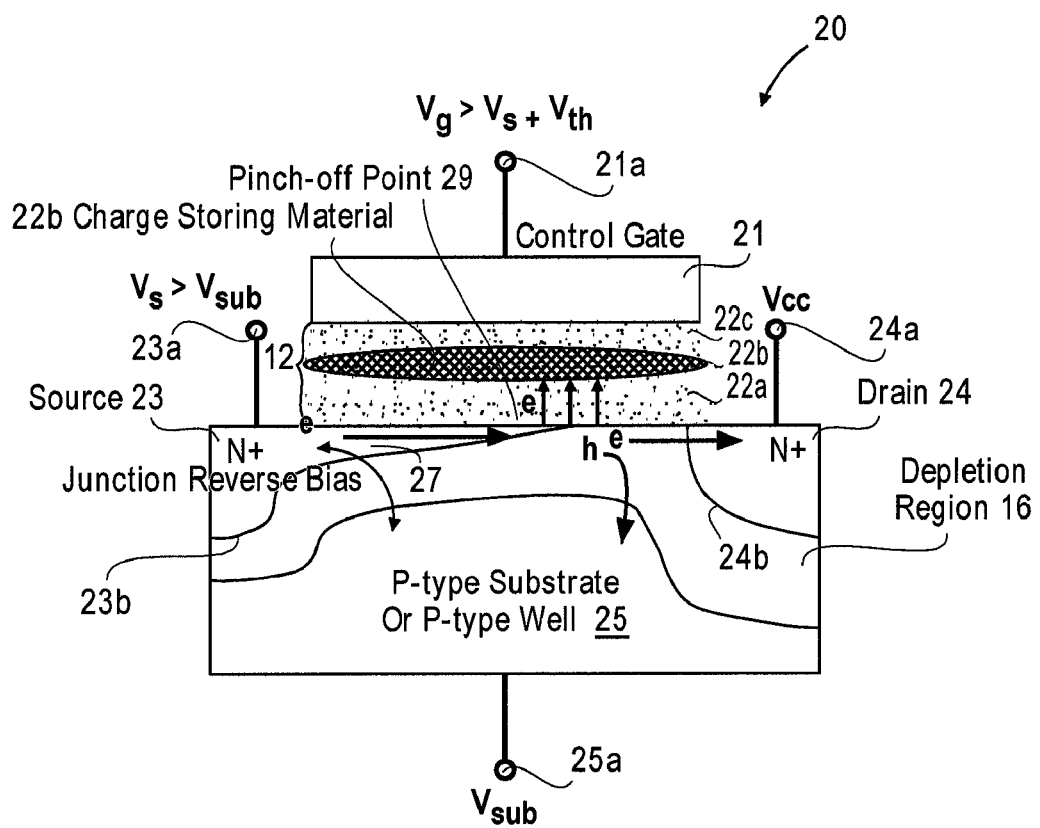
FIG. 2 shows the schematic of structure associated with the disclosed HCI programming for an N-type NVM. The drain electrode 24a of the N-type MOSFET in the NVM cell is supplied with the main voltage supply, $V_{cc}$.

In one aspect of this invention, an N-type Non-Volatile Memory (NVM) device 20 as shown in FIG. 2 includes N-type source 23 in an N+ region 23a and drain 24 in another N+ region 24a located in a P-type substrate or P-type Well 25. The control gate 21 is on top of but separated from the substrate 25 by thin dielectrics 22a and 22c and charge storing material 22b embedded in the thin dielectric 12. By applying a positive voltage to control gate terminal 21a an N-type channel region is formed between source 23 and drain 24 in the top surface of substrate 25. There is a depletion region 16 containing the pinch-off point 29 in the channel region. During the HCI programming, the drain electrode 24 of the MOSFET 20 in the NVM cell is biased positive with the main voltage supply $V_{cc}$. The source terminal 21a gets a voltage $V_s$ having a positive amplitude relative the substrate voltage $V_{sub}$ applied to the substrate terminal 25a. The control gate of MOSFET 20 in the N-type NVM cell is supplied with a voltage pulse having a positive voltage amplitude relative to the voltage applied to source terminal 23a ($V_g > V_s + V_{th}$), and in one embodiment a duration of about one (1) microsecond (1 µs). This duration can be any other appropriate time including less than one microsecond (1 µs). The positive voltage amplitude of this pulse $V_g$ applied to control gate 21 is greater than the threshold voltage $V_{th}$ of MOSFET 20 in the NVM cell and thus is sufficient to turn on the N-type NVM cell. By definition of an N-type MOSFET operation, the voltage $V_{cc}$ on drain terminal 24a is higher than the voltage on source 23 for electrons ("e") flowing from source region 23 to drain region 24. For programming optimization, the applied source voltage bias, $V_s$ must be more positive than the substrate voltage bias, $V_{sub}$ to create a reverse bias for the source-substrate junction 23b ($V_s > V_{sub}$). The reverse voltage bias between the source 23 and substrate 25, $V_s - V_{sub}$, is adjusted in amplitude such that the maximum threshold voltage shift of MOSFET 20 in the NVM cell is achieved with the same applied gate voltage pulse applied to the gate electrode 21a. During the voltage bias adjustment for source 23 and substrate 25, the voltage difference between the substrate 25 and the drain 24, $V_{cc} - V_{sub}$, must be capped below the avalanche multiplication junction breakdown voltage for a small programming current. Typically, this breakdown voltage is 6.72 volts for silicon so the cap on this voltage difference is 6.72 volts.

In another aspect of the present invention, N-type logic NVM cells 300a and 300b in a P-type substrate as shown in FIGS. 3 (a) and (b) each include an N-type well and gate electrode 363 with electrode 363a as the control gate and isolation dielectric regions built for sources and drains. Each NVM cell comprises the conducting floating polysilicon gates 321a and 321b, separated, respectively, from control gate 363 by portion of the dielectric 320 overlapping the N-type well control gate 363, and portion of the dielectric 320 at the other side of the channel in the N-type MOSFET. The drain electrode 340a and thus the drain 340 of the N-type logic NVM cell are biased with the main voltage supply, $V_{cc}$. The control gates 363 of the N-type single-gate NVM cells 300a and 300b are supplied with a voltage pulse with a positive voltage amplitude $V_g$ relative to the source voltage $V_s$ greater than the threshold voltage $V_{th}$ of the MOSFET in the NVM cell 300 to turn on the N-type MOSFET in NVM cell 300 ($V_g > V_s + V_{th}$). The duration of this voltage pulse is approximately one microsecond (1 μs) in one embodiment but can be more or less than one microsecond (1 μs) in other embodiments. By the definition of an N-type MOSFET operation, the drain terminal 340a voltage is higher than the source terminal 330b voltage for electrons ("e") flowing from the source 330 electrode to the drain electrode 340a. For programming optimization the applied source 330 voltage bias, $V_s$ must be more positive than the substrate voltage bias, $V_{sub}$ to create a junction reverse bias across the source-substrate junction 330b ($V_s > V_{sub}$). $V_{sub}$ is often set to 0. The reverse voltage bias between the source and substrate, $V_s - V_{sub}$, is adjusted such that the maximum threshold voltage shift of the N-type MOSFET in the NVM cells 300a and 300b is achieved with the same applied gate voltage pulse (i.e. with one applied gate voltage pulse). During the voltage bias adjustment for source 330 and substrate 350, the voltage difference between the substrate 350 and the drain 340, $V_{cc} - V_{sub}$, must be capped below the avalanche multiplication junction breakdown voltage for a small programming current. This cap is approximately 6.72 volts for silicon substrate.

Figure 4:
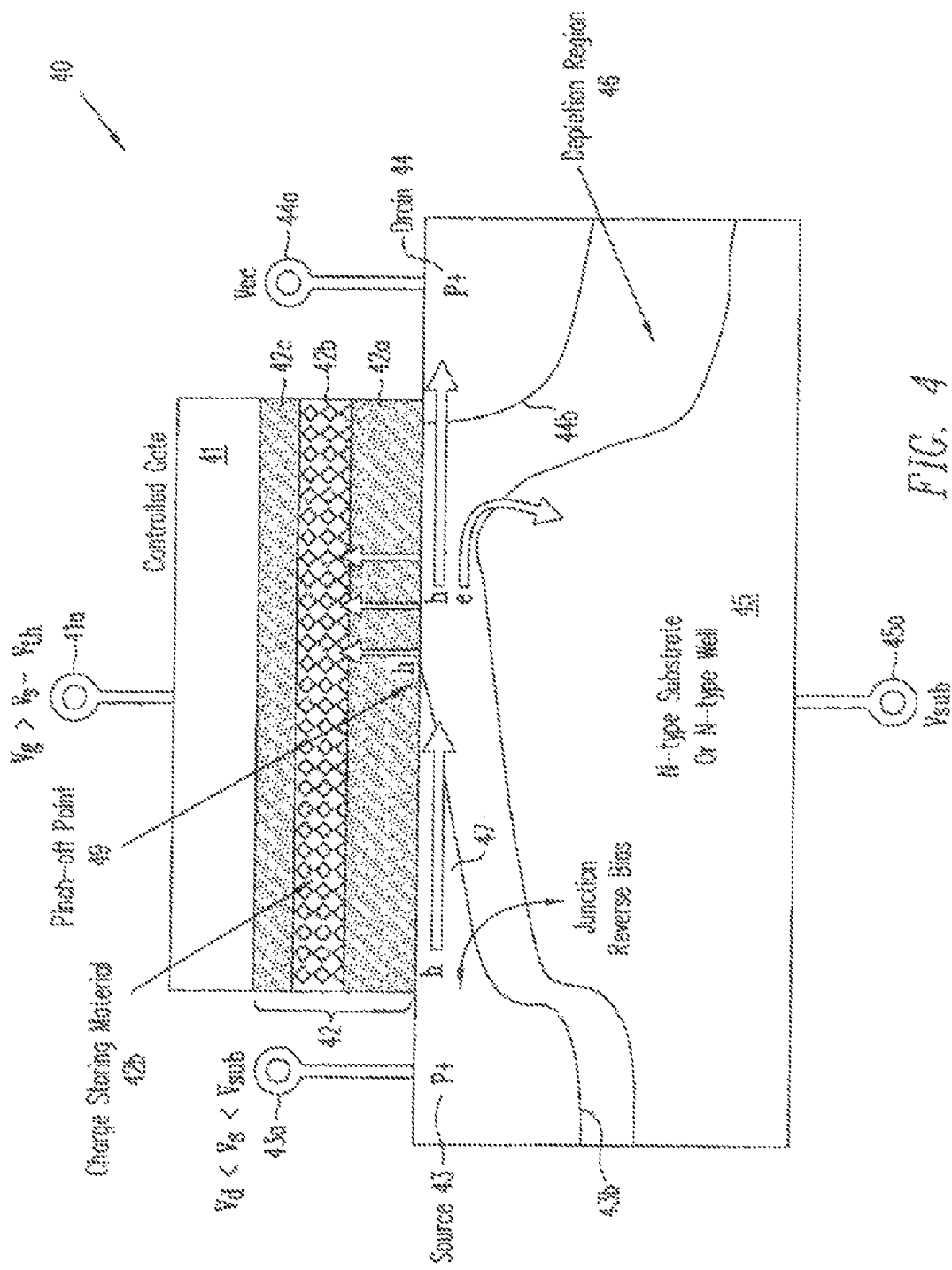
FIG. 4 shows the schematic of the proposed HCI programming for a P-type MOSFET 40 in an NVM cell The drain electrode 44a of the P-type MOSFET in the NVM cell is supplied with the main voltage supply, $V_{cc}$.

In another aspect of this invention, a P-type MOSFET 40 as shown in FIG. 4 includes a control gate 41 stacked on top of thin dielectric layers 42a and 42c with an embedded charge storing material 42b on the N-type semiconductor substrate 45 with two highly conductive P-type semiconductor regions forming source 43 and drain 44. During the HCI programming, the drain electrode 44a of the P+ MOSFET 40 in the NVM cell is biased with the main voltage supply $V_{cc}$. The control gate electrode 41a connected to control gate 41 of the P-type MOSFET 40 in the NVM cell is supplied with a voltage pulse with a voltage amplitude $V_g$ relative to the voltage on source 43 $V_s$ less than the threshold voltage $V_{th}$ of P-type MOSFET 40 in the NVM (negative threshold voltage) to turn the P-type NVM cell on ($V_g < V_s - V_{sub}$). In one embodiment, this pulse can have a duration of approximately one microsecond (1 μs). In other embodiments, this pulse can have a duration greater than or less than one microsecond (1 μs). By the definition of a P-type MOSFET operation, the source voltage $V_s$ must be higher than the drain voltage $V_d$ for holes ("h") flowing from the source 43 to the drain 44 ($V_d < V_s < V_{sub}$). For programming optimization, the voltage on the substrate 45 must be larger than the source 43 voltage to create a reverse bias across the junction 43b between the source 43 and the substrate 45. The junction reverse voltage bias across junction 43b between the source 43 and substrate 45, $V_{sub} - V_s$, is adjusted such that the maximum threshold voltage shift of the P-type MOSFET 40 in the NVM cell is achieved with the same applied gate voltage pulse. During the voltage bias adjustment for the substrate 45, the voltage difference between the substrate 45 and the drain electrode 44a, $V_{sub} - V_{cc}$, must be capped below the avalanche multiplication junction breakdown voltage across junction 44b for a small programming current. This capped voltage is 6.72 volts for silicon substrate.

Figure 5:
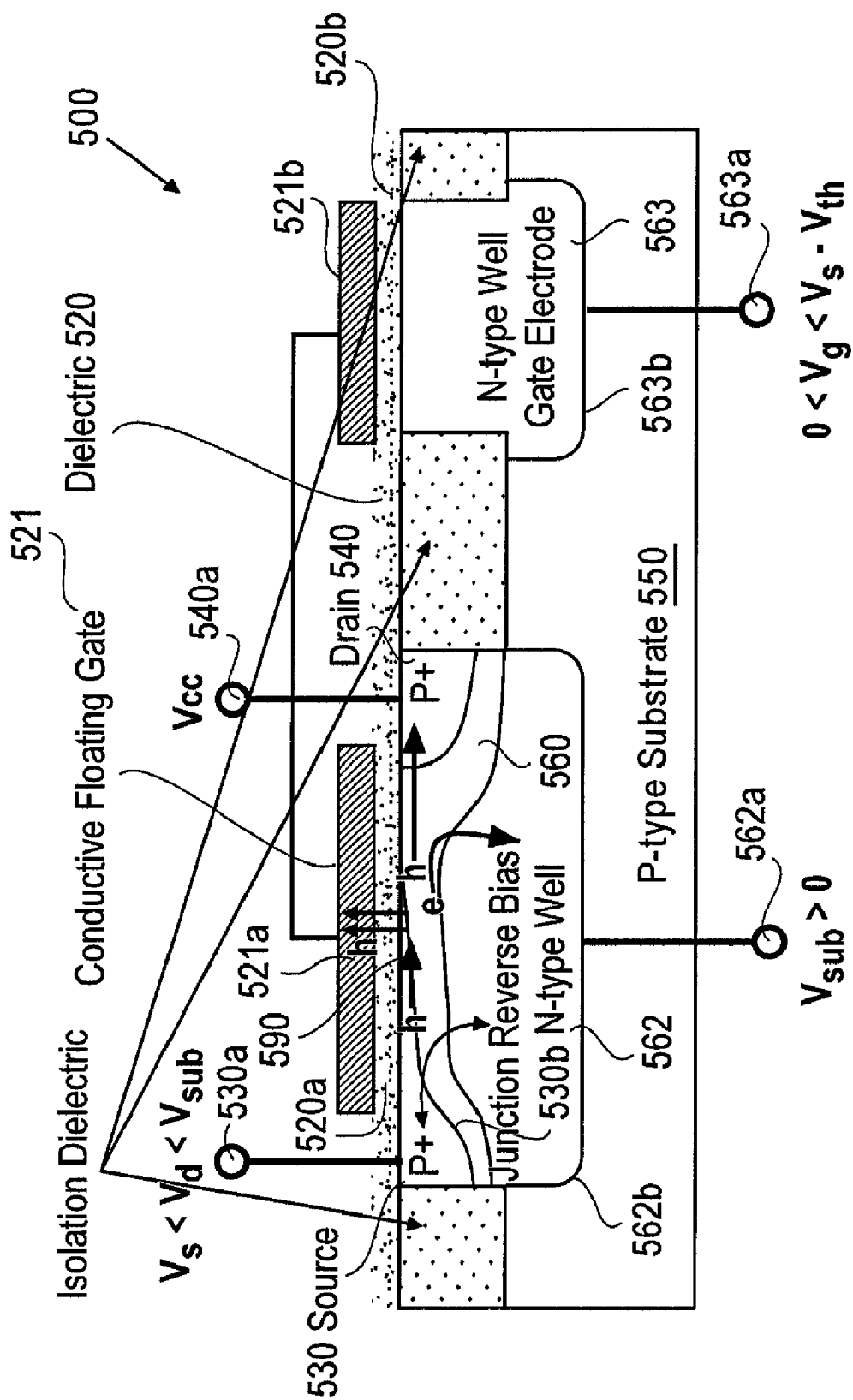
FIG. 5 shows the schematic of the proposed HCI programming for a P-type single-gate MOSFET in an NVM cell built in a P-type substrate 550 with an N-type well gate 563 connected to gate electrode 563a. The drain electrode 540a of the P-type MOSFET 500 in the NVM cell is supplied with the main supply voltage, $V_{cc}$.

In another aspect of the present invention, a P-type MOSFET 500 in an NVM cell as shown in FIG. 5 includes an N-type well electrode 563a connected to an N-type well Gate Electrode 563 which functions as the control gate. Polysilicon layers 521b and 521a function as the conducting floating gate 521 and are separated, respectively, by portion 520b of dielectric 520 overlying N-type well control gate 563 and portion 520a of dielectric 520 overlying the channel region of a P-type MOSFET having source 530 and drain 540. The drain electrode 540a of the P-type MOSFET 500 in the NVM cell is biased with the main voltage supply, $V_{cc}$. During programming, the control gate 563 of the P-type MOSFET 500 in the NVM cell is supplied with a voltage pulse with voltage amplitude $V_g$ relative to the voltage $V_s$ on source 530 less than the threshold voltage $V_{th}$ of the P-type MOSFET 500 in the NVM cell (negative threshold voltage) required to turn on the P-type logic NVM cell ($0 < V_g < V_s - V_{th}$). The duration of this voltage pulse is approximately one microsecond (1 μs) in one embodiment but can be more or less than one microsecond (1 μs) in other embodiments. However, the control gate voltage supplied to electrode 563a connected to N-type well 563 must be positive to prevent forward biasing junction 563b between the N-type well gate electrode 563 to the P-type substrate 550. By the definition of the operation of a P-type MOSFET such as MOSFET 500, the source 530 voltage $V_s$ must be higher than the drain 540 voltage $V_d$ for holes flowing from source 530 to drain 540. For example, if $V_{cc} = 3.3$ volts (drain), the source voltage could be 5.3 volts, the gate 563 could be 3 volts, and the substrate (i.e. N-well 562) could be 10 volts. However, although a higher voltage $V_s$ applied to the source 530 in this case, the main programming current will be loaded on the drain electrode 540a from the main chip voltage supply with low voltage drop ($V_s < V_d < V_{sub}$ as $V_{sub} > 0$ in P-substrate). For programming optimization, the voltage on the N-type well 562 of MOSFET 500 supplied through electrode 562a must be larger than the source 530 voltage, $V_s$, to junction reverse bias the PN junction between source 530 and N-type well 562. A charge pump will be used to apply a voltage higher than $V_{cc}$ to source electrode 530a and to the substrate electrode 562a electrically connected to N-type well 562, with lower current loads.

Note that the main current loading for HCI programming is from the drain electrode 540a. The programming current is the combination of impact ionization current generated by injecting the current (holes for a P-type device) from the source 530 into the strong electrical field in the depletion region 560. Drain 540 collects holes and the substrate (i.e. N-type well 562) collects electrons for a P-type device. According to charge conservation, the drain current must be larger than the substrate current and the injecting current from the source. The reverse voltage bias, $V_{sub}-V_s$, between the source 530 and an N-type substrate (actually N-type well 562 which functions as an N-type substrate) is adjusted such that the maximum threshold voltage shift of the NVM cell is achieved with the same (i.e. one) applied gate voltage pulse for a constant drain voltage below the source voltage. During the voltage bias adjustment, the voltage difference between the N-type substrate (i.e. well 562) and drain 540, $V_{sub}-V_{cc}$, of the P-type MOSFET 500 must be capped below the avalanche multiplication junction breakdown voltage for a small programming current. This voltage is 6.72 volts.

P-type substrate 550 must be held at a voltage below the voltages on N-type well 562 and N-type well gate electrode 563 to reverse bias PN junctions 562b and 563b.

Since the MOSFET shows the same characteristics with the identical electrical field strength relative to its electrodes (source, drain, substrate, and gate) regardless of their absolute voltage potentials, the application of $V_{cc}$ to the drain of P-type NVM for HCI can be equivalently replaced by connecting the drain to the low voltage of the main chip supply, that is, the ground voltage for obtaining the same highly efficient HCI programming. In the case of the previous example in FIG. 5, equivalently, the drain electrode 540a of the P-type device can be connected to ground, while the source 530 and substrate (N-well 562) are supplied with 2.3 volts and 6.7 volts, respectively. The voltage pulse with amplitude and duration of −0.3 V and 1 microsecond can be applied to the control gate electrode 563 through connection 563a.

It is also appreciated that, in different aspects of this invention, the Hot Carrier Injection (HCI) programming methods for supplying the main supply voltage, $V_{cc}$ to the drain electrode of the MOSFET in an NVM cell can be applied in different NVM structure variations.

Figure 1:
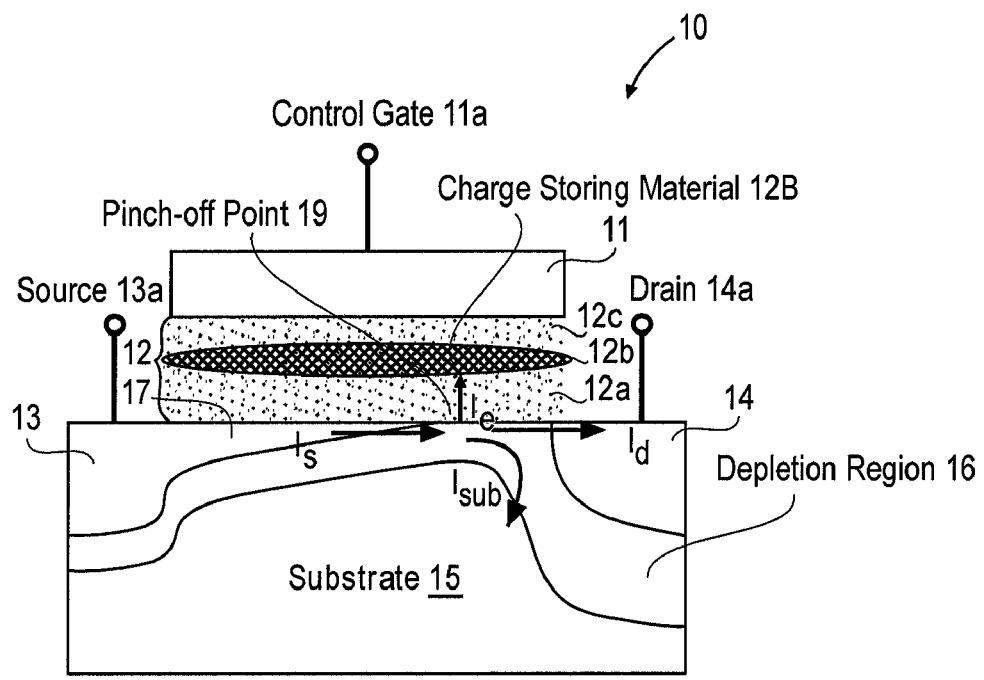
FIG. 1 illustrates conventional Hot Carrier Injection (HCI) for a Non-Volatile Memory (NVM) cell (N-type or P-type). The pinch-off point 19 is the only place where hot carriers can be injected toward the storing material 12b.

In an N-type NVM cell as shown in FIG. 2, the drain electrode 24a of the MOSFET 20 in the NVM cell is connected to the main voltage supply, $V_{cc}$. To optimize the program efficiency, the PN junction 23b between source 23 and substrate 25 is reverse biased. As compared with the MOSFET shown in FIG. 1, the effect of this reverse bias is to pull the pinch-off point 29 of the inversion region 27 back toward the source 23. This creates a larger area of the vertical field above the channel region between the pinch-off point 29 and the drain 24 and a stronger vertical field toward the control gate 21 in the depletion region 26 near the drain 24. The larger area and stronger vertical field in the depletion region 26 near the drain 24 injects more hot electrons generated from impact ionization in the depletion region 26 near the drain 24 toward the gate 21 resulting in higher programming efficiency. The programming efficiency has been improved by requiring tens to hundreds times less programming current than NVM cells using the conventional HCI scheme with the same applied pulse duration to achieve the same amount of threshold voltage shifts in the observed embodiments.

In one embodiment, N-type NVM cells were fabricated using 0.18 μm double-poly silicon process technology. The drain electrodes 24a of the NVM cells are supplied with the chip main voltage supply, 3.3 V. To optimize the HCI programming condition, a voltage pulse with amplitude of 7 V and pulse duration of 1 μs is applied to the control gate 21. The voltage biases supplied to the source 23 and the substrate 25 are adjusted to provide a reverse bias across PN junction 23b to reach the maximum threshold voltage shifts (~6V) during one voltage pulse applied to control gate electrode 21a. It was found that applying six tenths volts (0.6 V) to source electrode 23a and minus three and three tenths volts (−3.3 V) to substrate electrode 25a allows the programming to reach the optimized condition. The maximum programming current (drain current) is about 0.5 μA, which is much smaller than currents in the range of hundred to tens of μA using conventional HCI programming. The voltage difference between drain electrode 24a and substrate electrode 25a is 6.6 volts which is smaller than the avalanche multiplication junction breakdown voltage 6×Eg (~6.72 V for silicon, where Eg=1.12 V is the bandgap energy for silicon).

In another embodiment, N-type NVM cells were fabricated using 0.18 μm double-poly silicon process technology. The drain electrodes 24a of the N-type MOSFETs in the NVM cells were supplied with the chip main voltage supply, 2.7 V, which is the lower specification for the main voltage supply. A voltage pulse with amplitude of 6.4 volts and duration of 1 μs is applied to the gate electrode 21a. It was found for the voltage biases that applying zero volts (0V) to the source electrode 23a and minus four volts (−4V) to the substrate electrode 25a gave the maximum threshold voltage shift of 6 V. The maximum programming current (drain current) is about 0.5 μA, which is much smaller than currents in the range of hundreds to tens of μA using conventional HCI programming. The voltage across the PN junction 24b between the drain 24 and the substrate 25 was six and seven tenths volts (6.7 V) which is smaller than the avalanche multiplication junction breakdown voltage 6×Eg (~6.72 V for silicon, where Eg=1.12 V is the bandgap energy for silicon).

In another embodiment, N-type NVM cells were fabricated using 0.18 μm double-poly silicon process technology. The drain electrodes 24a of the NVM cells were supplied with the chip main voltage supply, one and eight tenths volts [1.8 V], which is a standard main voltage supply for a 0.18 μm technology node. A voltage pulse with amplitude of 5.4 volts and duration of one microsecond (1 μs) is applied to the gate electrode 21a. It was found for the voltage bias that supplying minus one volt (−1 V) to source electrode 23a and minus four and eight tenths volts (−4.8V) to substrate electrode 25a, gave the maximum threshold voltage shift of 6 V. The maximum programming current (drain current) is about 0.5 μA, which is much smaller than currents in the range of hundred to tens of μA using conventional HCI programming. The voltage across PN junction 24b between drain 24 and substrate 25 is 6.6 volts which is smaller than the avalanche multiplication junction breakdown voltage 6×Eg (~6.72 V for silicon, where Eg=1.12 V is the bandgap energy for silicon).

Referring to the N-type MOSFETs 300a and 300b for a logic NVM cell as shown in FIGS. 3 (a) and (b), the drain electrode 340a of the NVM cell is connected to the main voltage supply, $V_{cc}$. To optimize the program efficiency, a reverse voltage bias is supplied across PN junction 330b between source electrode 330a and substrate (i.e. P-type well 361) electrode 351 (FIG. 3(b)). The effect of this reverse bias is to pull the pinch-off point 390 back toward the source 330 and create a larger area of vertical field and stronger vertical field toward portion 321a of the floating gate 321 in the depletion region 360 near the drain 340. The larger area and stronger vertical field in the depletion region 360 near the drain 340 injects more hot electrons generated from impact ionization in the depletion region 360 near the drain 340 toward the portion 321a of floating gate 321 resulting in higher programming efficiency than in the prior art.

Figure 3A:
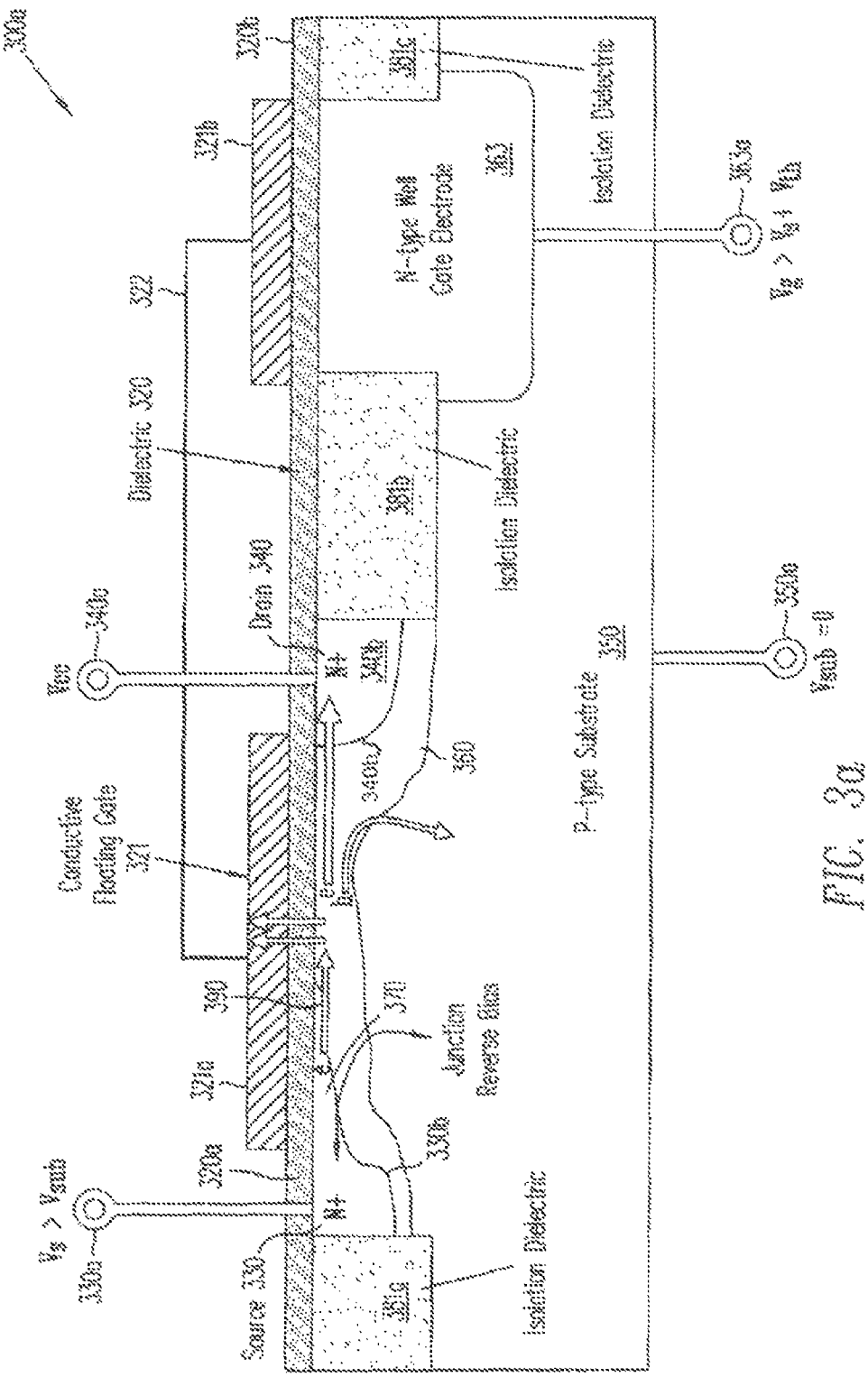

In one embodiment, an N-type logic NVM cell using a 5 V I/O N-type MOSFET in standard logic process as shown in FIG. 3 (a) was fabricated with 0.5 μm process technology. The drain electrodes 340a of the N-type MOSFETs in the NVM cells were supplied with the main supply voltage, 5 V. As shown in FIG. 3(a), the substrate 350 is constrained to be at zero volts (0 V) by applying zero volts to electrode 350a. A voltage pulse with amplitude of 9 volts and duration of one and one-tenth milliseconds (1.1 ms) is applied to the logic NVM cell. To optimize the HCI programming condition for voltage bias to achieve the maximum threshold voltage shift of 2.5 V, a voltage of 2.2 V is applied to the source electrode 330a. The voltage across the PN junction 340b between drain 340 and substrate 350 is 5 volts which is smaller than the avalanche multiplication junction breakdown voltage 6×Eg (~6.72 V for silicon, where Eg=1.12 V is the bandgap energy for silicon).

In another embodiment, an N-type logic NVM cell using a 3.3 V I/O N-type MOSFET in a standard 0.35 μm logic process as shown in FIG. 3(b) was provided. The drain electrodes 340a of the N-type MOSFETs 300b in the NVM cells were supplied with the main voltage supply, three and three tenths volts (3.3 V). To optimize the HCI programming condition for a voltage pulse with amplitude of 7V and duration of 3 ms applied to the gate electrode 364, the maximum threshold voltage shift is achieved by adjusting the reverse bias voltage across the PN junction 330b between the source 330 and substrate (i.e. P-type well 361). It was found that five tenths of a volt (0.5 V) applied to source electrode 330a and minus three and four tenths volts (−3.4 V) applied to substrate (i.e. P-well 361) electrode 351 gave the maximum threshold voltage shifts (~3V) The voltage across the PN junction 340b between drain 340 and substrate (i.e. P-well 361) is 6.7 volts which is smaller than the avalanche multiplication junction breakdown voltage 6×Eg (~6.72 V for silicon, where Eg=1.12 V is the bandgap energy for silicon).

A P-type MOSFET 40 for use in an NVM cell is shown in FIG. 4. In MOSFET 40, the drain electrode 44a of the NVM cell is connected to the main voltage supply, $V_{cc}$, or $V_{ss}$. To optimize the program efficiency, the PN junction 43b between source electrode 43a and substrate electrode 45a is reverse biased. As compared with FIG. 1, the effect of reverse bias is to pull the pinch-off point 49 back toward the source 43 and create a larger area of vertical field and stronger vertical field toward the control gate 41 in the depletion region 46 near the drain 44. The larger area and stronger vertical field in the depletion region 46 near the drain 44 injects more hot holes generated from impact ionization in the depletion region 46 near the drain 44 toward the gate 41 resulting in higher programming efficiency than in the prior art.

A P-type MOSFET 500 for use in an NVM cell is shown in FIG. 5. In the structure of FIG. 5, the drain electrode 540a of the NVM cell is connected to the main voltage supply, $V_{cc}$, or $V_{ss}$. To optimize the program efficiency, the PN junction 530b between the source 530 and the substrate (i.e. N-type well 562) is reverse biased. The effect of this reverse bias is to pull the pinch-off point 590 back toward the source 530 and create in the depletion region 560 near the drain 540 a larger area of vertical field and stronger vertical field toward the portion 521a of floating gate 521. The larger area and stronger vertical field in the depletion region 560 near the drain 540 injects more hot holes generated from impact ionization in the depletion region 560 near the drain 540 toward the portion 521a of floating gate 521 resulting in higher programming efficiency than in the prior art.

Figure 6A:
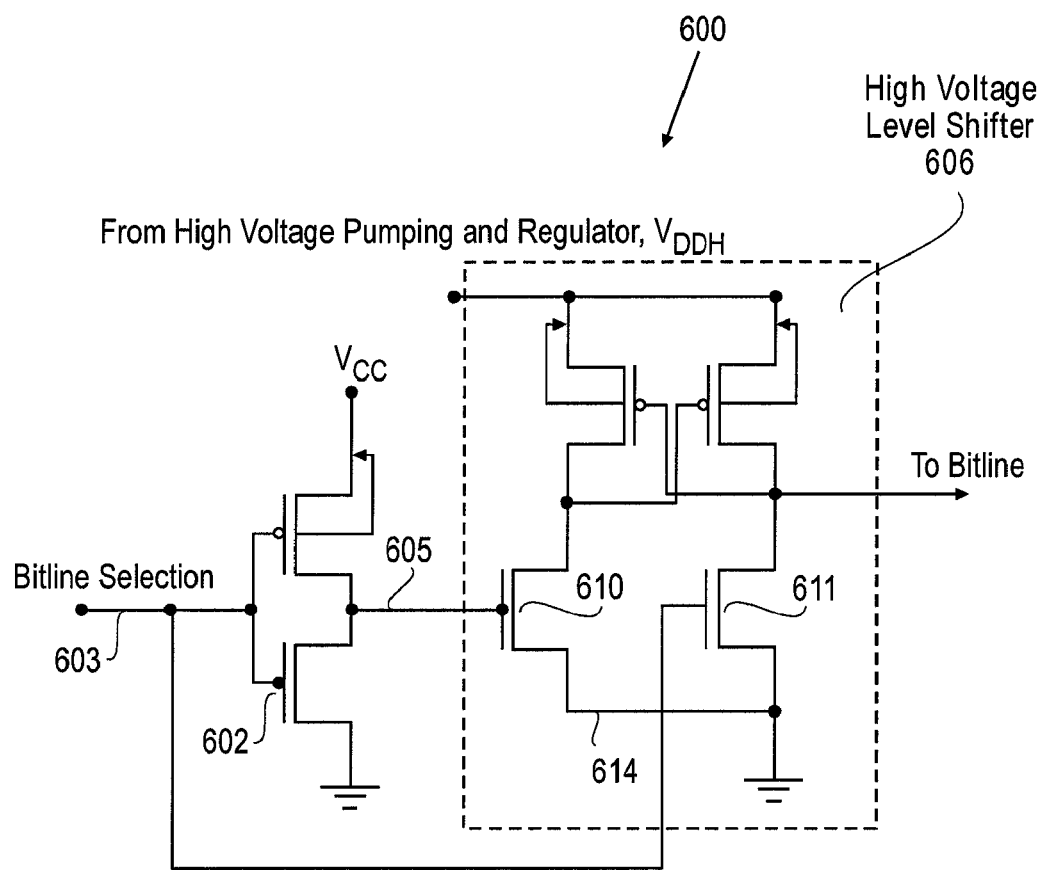
FIGS. 6(a) and (b) show a bitline switch (a) with a typical high voltage level shifter 606 for switching a high voltage to a bitline in an array of NVM cells and (b) without a high voltage level shifter for a normal switch for switching a high voltage to a bitline in an array of NVM cells. At least four extra transistors including two high voltage transistors are required for the high voltage switch shown in FIG. 6(a).
Figure 6B:
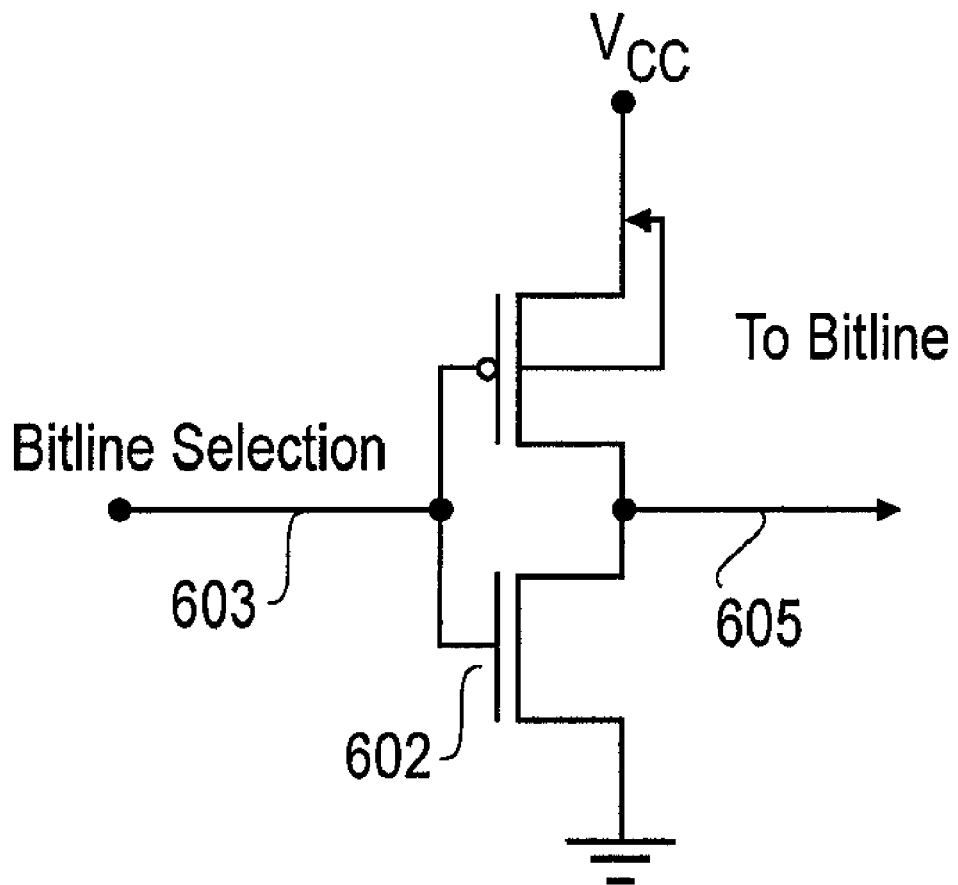

FIG. 6 (a) shows a typical bitline decoder 600 for one bitline with a high voltage level shifter 606 and FIG. 6 (b) shows a typical bitline decoder without a high voltage level shifter, respectively. It is seen from FIG. 6(a) that the high voltage level shifter 606 requires at least four transistors (two high voltage P-type MOSFETs 608 and 609 and two N-type MOSFETs 610 and 611 having source 614). Usually, an on-chip stable high voltage supply requires a high voltage pumping and a regulator circuit to provide the shifted high voltage $V_{DDH}$. The number of transistors required in the high voltage level shifter 606 could be more depending on how high a voltage the transistors can experience in the circuitry. The bitline decoder of FIG. 6(b) is simple, using only a P-type MOSFET 601 connected in series with an N-type MOSFET 602. When the Bitline Selection signal on input terminal 603 goes low, the output signal on output lead 605 goes to $V_{cc}$. In accordance with this invention, this output signal is then applied to the drains of the N-type MOSFETs in the NVM cells connected to the bitline. Each NVM cell can then be programmed by applying appropriate voltages to the control gate, source electrode and substrate as described above. Without the high voltage level shifter 606 shown in FIG. 6(a), the bitline decoder circuit in the bitline region, where space is tight according to the bitline pitch, is greatly simplified. The operation of the circuits shown in FIGS. 6(a) and 6(b) is well known to those skilled in the relevant art and thus will not be described.

Figure 7:
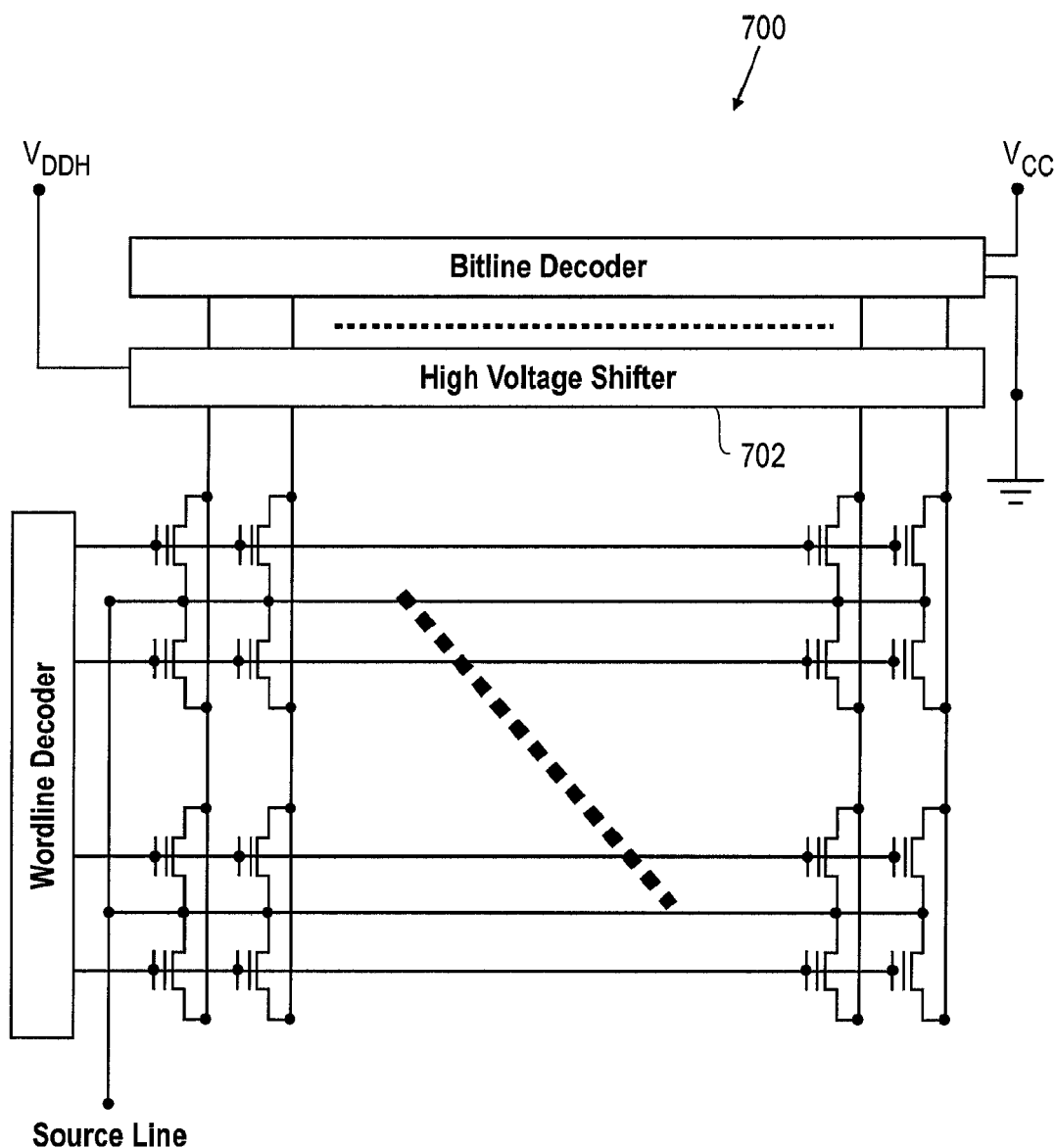
FIG. 7 shows a high voltage decoder circuit block 700 including high voltage shifter block 702 containing a plurality of high voltage level shifters 606 as shown in FIG. 6(a) used in the conventional HCI programming scheme for a NOR-type NVM cell array.
Figure 8:
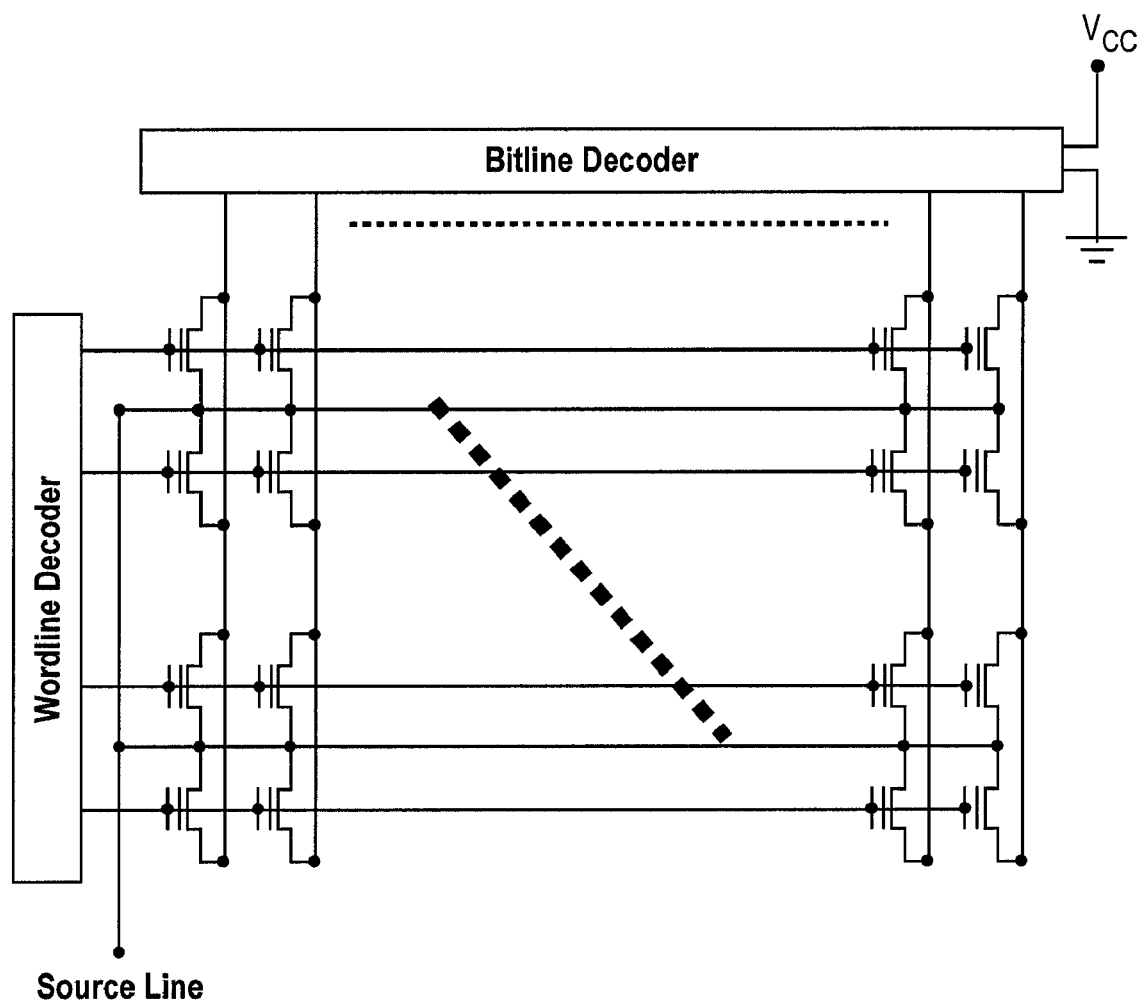
FIG. 8 shows the simplified programming circuitry without the high voltage shifter circuitry using the conventional logic decoder in the present invention for a NOR-type NVM cell array.

FIG. 7 and FIG. 8 show the block schematics for an N-type NOR NVM array 700 set in between the Bitline Decoder and the Wordline Decoder and Source Line with (shown in the top two rows of circuitry in FIG. 7) and without (shown in the circuitry below the top two rows of circuits) the high voltage level shifter 702, respectively. It is clearly seen that the area for the layout of the high voltage level shifter 702 can be totally omitted in the present invention thereby making possible a smaller die size for a given-size NVM array. The bold dash line represents the omitted high voltage level shifters. This means that the given-size NVM array will be less expensive to manufacture because more chips can be fabricated using a given size wafer.

Another benefit of applying the main chip voltage supply to the bitline of an NVM array for HCI programming is that the highest current path in the drain electrode of NVM cells for HCI programming has been removed from the high voltage supply node to the main voltage supply node. The main chip voltage supply, $V_{cc}$ ($V_{ss}$), is given from an external power regulator. Usually, an on-chip stable high voltage supply requires a charge pumping circuit and a regulator circuit biased against a stable bandgap circuit. To sustain a high voltage and high current load with an on-chip voltage supply requires larger capacitors to store enough charge for discharging in response to the current load. Thus, the more stable the high voltage supply and the higher the current load, the more chip area is required for the on-chip high voltage supply circuitry. This increases chip size compared to the chip size achievable with the present invention and thus also increases chip cost. The present invention avoids these increases in size and cost by using the main chip supply voltage, $V_{cc}$ ($V_{ss}$), to supply the voltage to the drains of the memory cells in the NVM memory array.

Since the discharging process during HCI programming is a transient process, insufficient capacity of voltage supply and insufficient current load will affect the programming uniformity and even lead to pump circuit failure. It is noticed that the recovery time for charge pump circuitry is even longer after discharging for charge pumping circuits with larger capacitors. These issues for the high voltage and current loading in the conventional HCI programming are eliminated by the present invention.

Another benefit of this invention is that the method of optimization can reduce the observed programming current up to 50 times compared with the programming current in the conventional HCI programming. Due to the low current operation, the new HCI programming enables programming of more NVM cells in one programming shot with great uniformity. The one programming shot applies a voltage pulse to a worldline connected to the control gates of the MOSFETs associated with that worldline in the NVM array, where the worldline covers a number of parallel NVM cells. Meanwhile, the parallel NVM cells are programmed by switching on the drain voltage bias from the bitlines according to the information to be stored. This invention provides fast and uniform parallel programming in NVM arrays.

In summary, methods and structures for new HCI programming have been disclosed. The new methods and associated structures lead to fast parallel programming and simplify the circuitry in non-volatile memories.

What is claimed is:

1. A method for programming a metal oxide semiconductor field effect transistor (MOSFET) in a non-volatile memory cell, said transistor having a source, a drain and a channel region between the source and the drain, said source, drain and channel region being formed in a substrate of opposite conductivity type to the conductivity type of said source and said drain, said method comprising:
   connecting the drain electrode of said MOSFET to either the supply source of the main voltage, or ground, provided to said non-volatile memory cell;
   inverting a portion of the channel region extending from the source toward the drain, the inverted portion of the channel region ending at a pinch-off point before reaching the drain; and
   optimizing the programming efficiency of the MOSFET by reverse biasing the PN junction between the source and substrate to a selected reverse-biased voltage thereby to pull the pinch-off point of the inversion region back toward the source.

2. The method of claim 1 wherein optimizing the programming efficiency creates a larger area of the vertical field above the channel region between the pinch-off point and the drain and a stronger vertical field toward the charge storage region in the depletion region near the drain.

3. The method of claim 2 wherein the larger area of the vertical field above the channel region between the pinch-off point and the drain and the stronger vertical field toward the floating gate in the depletion region near the drain injects charge generated from impact ionization in the depletion region near the drain toward the charge storage region in the MOSFET resulting in a high programming efficiency.

4. The method of claim 3 wherein the charge storage region in the MOSFET comprises a floating gate.

5. The method of claim 3 wherein the charge storage region in the MOSFET comprises silicon nitride film.

6. The method of claim 3 wherein the charge storage region in the MOSFET comprises nanocrystals.

7. The method of claim 1 wherein said MOSFET is an N-type MOS transistor.

8. The method of claim 7 wherein said charge is electrons.

9. The method of claim 1 wherein said MOSFET is a P-type MOS transistor.

10. The method of claim 9 wherein said charge is holes.

11. Structure for programming a metal oxide semiconductor field effect transistor (MOSFET) in a non-volatile memory cell, said transistor having a source, a drain, a channel region between the source and the drain, and a control gate over but separated by dielectric and a charge storage region in said dielectric from said channel region, said source, drain and channel region being formed in a substrate of opposite conductivity type to the conductivity type of said source and said drain; said structure comprising:
   means for connecting the drain electrode of said MOSFET to a supply source of the main voltage, or ground, provided to said non-volatile memory cell;
   means for supplying selected voltages to said source, said substrate and said control gate thereby to invert a portion of the channel region extending from the source toward the drain, the inverted portion of the channel region ending at a pinch-off point before reaching the drain; and
   means for reverse biasing the PN junction between the source and the substrate to pull the pinch-off point of the inversion region back toward the source thereby to optimize the programming efficiency of the MOSFET.

12. The structure of claim 11 wherein said means for supplying selected voltages to said source, said substrate and said control gate comprises means for creating a large area of the vertical field above the channel region between the pinch-off point and the drain and a strong vertical field toward the charge storage region in the depletion region near the drain.

13. The structure of claim 11 wherein said means for supplying selected voltages to said source, said substrate and said control gate causes the formation of a relatively large area of the vertical field above the channel region between the pinch-off point and the drain and a strong vertical field toward the floating gate in the depletion region near the drain thereby to inject more hot electrons generated from impact ionization in the depletion region near the drain toward the charge storage region in the MOSFET to thereby yield a relatively high programming efficiency.

14. The structure of claim 11 wherein the charge storage region in the MOSFET comprises a floating gate.

15. The structure of claim 11 wherein the charge storage region in the MOSFET comprises silicon nitride film.

16. The structure of claim 11 wherein the charge storage region in the MOSFET comprises nanocrystals.

17. The structure of claim 11 wherein said MOSFET is an N-type MOS transistor.

18. The structure of claim 11 wherein said MOSFET is a P-type MOS transistor.

19. A nonvolatile memory array including a plurality of transistors as recited in claim 11.

20. The nonvolatile memory array as in claim 19 including means for applying to the drains of the transistors in the nonvolatile memory cells in the memory array the voltage $V_{cc}$ or the ground voltage from the source of the supply voltage to the memory array.

21. A method for programming an N-type metal oxide semiconductor field effect transistor (MOSFET) in a non-volatile memory cell, said transistor having a source, a drain and a channel region between the source and the drain, said transistor further having a control gate formed over dielectric above said channel region and a charge storage region formed in said dielectric, said source, drain and channel region being formed in a substrate of opposite conductivity type to the conductivity type of said source and said drain, said method comprising:
   applying a first voltage to said drain electrode;
   applying to said control gate a second voltage greater than said first voltage so as to form in said channel region an inversion region extending from the source toward the drain, the second voltage being selected so that the inversion region ends at a pinch-off point before reaching the drain; and
   reverse biasing the PN junction between the source and substrate to a selected value by applying a third voltage to said source and a fourth voltage to said substrate, said third voltage being less than said first voltage and more than said fourth voltage, thereby together with said second voltage causing said pinch-off point to be located at a point between the source and the drain so as to improve the programming efficiency of the MOSFET;

wherein the difference between said first voltage and said fourth voltage is capped to be below the avalanche multiplication junction breakdown voltage.

22. The method of claim 21 wherein the third voltage and the fourth voltage are selected so that the maximum threshold voltage shift of said transistor is achieved during programming with one voltage pulse applied to said control gate.

23. The method of claim 22 wherein said one voltage pulse has a duration of about one (1) microsecond.

24. The method of claim 21 wherein reverse biasing the PN junction between the source and the substrate improves the programming efficiency by creating a vertical electric field in the area above the channel region between the pinch-off point and the drain, said vertical field pointing toward the charge storage region in the depletion region near the drain.

25. The method of claim 24 wherein the vertical field above the channel region between the pinch-off point and the drain and pointing toward the charge storage region injects hot electrons generated from impact ionization in the depletion region near the drain toward the charge storage region resulting in improved programming efficiency compared to prior hot carrier injection methods.

26. The method of claim 24 wherein the charge storage region in the MOSFET comprises a floating gate.

27. The method of claim 24 wherein the charge storage region in the MOSFET comprises silicon nitride film.

28. The method of claim 24 wherein the charge storage region in the MOSFET comprises nanocrystals.

29. Structure for programming a metal oxide semiconductor field effect transistor (MOSFET) in a non-volatile memory cell, said transistor having a source, a drain, a channel region between the source and the drain, and a control gate over but separated by dielectric from said channel region, and a charge storage region in said dielectric, said source, drain and channel region being formed in a substrate of opposite conductivity type to the conductivity type of said source and said drain; said structure comprising:
  means for supplying a first voltage to the drain electrode of said MOSFET;
  means for supplying a second voltage to said control gate, a third voltage to said source and a fourth voltage to said substrate, thereby to invert a portion of the channel region extending from the source toward the drain, the inverted portion of the channel region ending at a pinch-off point before reaching the drain; and
  means for controlling the reverse bias across the PN junction between the source and the substrate by controlling the values of said third voltage and said fourth voltage to pull the pinch-off point of the inversion region back toward the source thereby to improve the programming efficiency of the MOSFET;
  wherein said fourth voltage differs from said first voltage by an amount less than the avalanche breakdown junction voltage of the PN junction between said drain and said substrate.

30. The structure of claim 29 wherein said means for supplying selected voltages to said source, said substrate and said control gate creates a vertical field above the channel region between the pinch-off point and the drain, said vertical field pointing toward the charge storage region above the depletion region near the drain.

31. The structure of claim 29 wherein said means for supplying selected voltages to said source, said substrate and said control gate causes the formation of a vertical field above the channel region between the pinch-off point and the drain, said vertical field pointing toward the floating gate from the depletion region near the drain thereby to inject hot electrons generated from impact ionization in the depletion region near the drain toward the charge storage region in the MOSFET to thereby yield a high programming efficiency.

32. The structure of claim 29 wherein the charge storage region in the MOSFET comprises a floating gate.

33. The structure of claim 29 wherein the charge storage region in the MOSFET comprises silicon nitride film.

34. The structure of claim 29 wherein the charge storage region in the MOSFET comprises nanocrystals.

35. The structure of claim 29 wherein said MOSFET is an N-type MOS transistor.

36. The structure of claim 29 wherein said MOSFET is a P-type MOS transistor.

37. A nonvolatile memory array including a plurality of transistors as recited in claim 29.

38. The nonvolatile memory array as in claim 37 including means for applying to the drains of the transistors in the nonvolatile memory cells in the memory array the voltage $V_{cc}$ or the ground voltage $V_{ss}$ from the source of the supply voltage to the memory array.

* * * * *